(12) United States Patent
Box

(10) Patent No.: US 7,391,502 B2
(45) Date of Patent: Jun. 24, 2008

(54) LITHOGRAPHIC APPARATUS, DEVICE MANUFACTURING METHOD, AND METHOD OF MANUFACTURING A COMPONENT

(75) Inventor: Wilhelmus Josephus Box, Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 362 days.

(21) Appl. No.: 10/785,046

(22) Filed: Feb. 25, 2004

(65) Prior Publication Data

US 2004/0165173 A1 Aug. 26, 2004

Related U.S. Application Data

(63) Continuation of application No. 10/307,485, filed on Dec. 2, 2002, now Pat. No. 6,747,730.

(30) Foreign Application Priority Data

Dec. 4, 2001 (EP) ................... 01310155

(51) Int. Cl.
*G03B 27/32* (2006.01)
*G03B 27/42* (2006.01)
*H01L 21/00* (2006.01)

(52) U.S. Cl. ............... 355/77; 355/53; 438/72

(58) Field of Classification Search ........... 355/77, 355/53, 67, 55, 57; 438/72, 947; 430/5, 430/322; 359/361, 350; 419/20
See application file for complete search history.

(56) References Cited

U.S. PATENT DOCUMENTS 4,924,701 A 5/1990 Delatorre (Continued)

FOREIGN PATENT DOCUMENTS

KR 2001-0041491 5/2001

(Continued)

OTHER PUBLICATIONS

"Zerodur Glass Ceramic" p. 4, www.schott.com/optics_devices/english/download/zerodur_catalog_2004.pdf?PHPSESSID=91 (2004).*

(Continued)

*Primary Examiner*—Peter B Kim
(74) *Attorney, Agent, or Firm*—Pillsbury Winthrop Shaw Pittman LLP

(57) ABSTRACT

A method of manufacturing a component that will, in use, experience a thermal load and will be operated at a mean temperature, includes selecting a material having a coefficient of thermal expansion having a zero-crossing at a first temperature and manufacturing the component using the selected material at a second temperature. The first temperature is between the second temperature and the mean operating temperature. Deformation of the component at the mean operating temperature are thus minimized. A lithographic apparatus includes a radiation system configured to provide a beam of radiation and a projection system configured to project a patterned beam of radiation onto a target portion of a substrate. At least one component of the apparatus that in use experiences a thermal load is made of the selected material. A device manufacturing method includes providing a beam of radiation using a radiation system, patterning the beam, and projecting the patterned beam onto a target portion of the layer of radiation-sensitive material using a projection system. At least one component of the radiation system and/or projection system that experiences a thermal load in use is made of the selected material.

26 Claims, 1 Drawing Sheet

U.S. PATENT DOCUMENTS

| | | | |
|---|---|---|---|
| 5,265,143 | A | 11/1993 | Early et al. |
| 5,303,588 | A | 4/1994 | Hamisch et al. |
| 6,132,676 | A * | 10/2000 | Holzer et al. ................. 419/20 |
| 6,159,643 | A | 12/2000 | Levinson et al. |
| 6,465,272 | B1 | 10/2002 | Davis, Jr. et al. |
| 2001/0010579 | A1* | 8/2001 | Nishi .......................... 355/67 |
| 2002/0064655 | A1* | 5/2002 | Morin et al. ................ 428/375 |
| 2002/0075466 | A1* | 6/2002 | Gruner et al. ................ 355/53 |

FOREIGN PATENT DOCUMENTS

WO     WO 01/07969 A1     2/2001

OTHER PUBLICATIONS

Korean Office Action issued in Korean Application No. 10-2002-0075855 and dated Oct. 24, 2005.
Abstract No. XP-002198547, "Optics Guide 3", 1985, Melles Griot, Irvine, CA, p. 68.

* cited by examiner

LITHOGRAPHIC APPARATUS, DEVICE MANUFACTURING METHOD, AND METHOD OF MANUFACTURING A COMPONENT

CROSS REFERENCE TO RELATED APPLICATIONS

This application is a continuation of U.S. application Ser. No. 10/307,485, filed Dec. 2, 2002, now U.S. Pat. No. 6,747,730, and claims priority to European Application 01310155.5, filed Dec. 4, 2001, the entire contents of both of which are hereby incorporated in their entirety.

BACKGROUND OF THE INVENTION

1. Field of the Invention

The present invention relates to a lithographic projection apparatus, a device manufacturing method, and a method of manufacturing an optical element.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the radiation beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB) development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to image ever smaller features, it has been proposed to use EUV radiation, with a wavelength in the range of from 5 to 20 nm, as the exposure radiation instead of UV, with a wavelength of 193 or 157 nm, as is used in current commercial lithography devices. No material capable of forming a refractive lens for optical elements in radiation and/or projections systems for EUV radiation is known so that the radiation and projection systems of an EUV lithographic apparatus must be made using mirrors, usually multilayer mirrors. The quality of the projected image is extremely sensitive to surface deformations (figure errors) in the mirrors, particularly those of the projection system. In order to prevent surface deformations caused by temperature variations, the mirrors are formed by depositing the multilayer stack on a substrate having the desired figure and made of a material having an extremely low, or zero, coefficient of thermal expansion (CTE). Various such materials are commercially available from a variety of suppliers. One, ZERODUR™, is a glass ceramic made with various additives to provide the desired low CTE. While these materials have a very low CTE, the CTE is exactly zero at only one temperature so that some thermal expansion and contraction does take place, leading to surface deformations and a loss of image quality.

SUMMARY OF THE INVENTION

According to an aspect of the present invention a method of manufacturing a component that will, in use, experience a thermal load and will be operated at a mean temperature, includes selecting a material having a coefficient of thermal expansion having a zero-crossing at a first temperature and manufacturing the component using the selected material at a second temperature. The first temperature is between the second temperature and the mean operating temperature. Deformations of the component at the mean operating temperature are thus minimized.

The first temperature may be the average of the second temperature and the mean operating temperature. Alternatively, the integral of the coefficient of thermal expansion of the selected material from the second temperature to the mean operating temperature is substantially zero. The selected material may be a material having a low coefficient of thermal expansion or a material having a substantially zero coefficient of thermal expansion. The selected material may be a glass, or a glass-ceramic including additives to provide the coefficient of thermal expansion. The second (manufacturing temperature may be adjusted to enable use of a material having a coefficient of thermal expansion zero-crossing temperature that is fixed or of limited variability (i.e., substantially fixed).

According to a further aspect of the invention there is provided a component for use in a lithographic apparatus, the apparatus being configured to project a patterned beam of radiation onto a target portion of a substrate. The component is made of a material having a coefficient of thermal expansion having a zero-crossing at a first temperature between a second temperature at which the component is manufactured and a mean operating temperature of the component.

The component may be an optical component in at least one of a radiation system or a projection system of the apparatus. The optical component may be an optical element or elements in the radiation system and/or projection system that experiences the highest thermal load in use. The optical component may be a mirror. The mirror may include a substrate manufactured from a material having a low coefficient of thermal expansion and a multilayer stack.

According to a still further aspect of the present invention there is provided a lithographic apparatus including a radiation system configured to provide a beam of radiation and a support configured to support a patterning device which is configured to pattern the beam of radiation according to a desired pattern. The apparatus also includes a substrate table configured to hold a substrate and a projection system configured to project the patterned beam of radiation onto a target portion of the substrate. At least one component of the apparatus that in use experiences a thermal load is made of a material having a coefficient of thermal expansion having a zero-crossing at a temperature between a manufacturing temperature and a mean operating temperature of the component.

According to an even further aspect of the present invention there is provided a device manufacturing method including providing a beam of radiation using a radiation system. The method also includes using a patterning device to endow the beam of radiation with a pattern in its cross-section and projecting the patterned beam of radiation onto a target portion of the layer of radiation-sensitive material at least partially covering a substrate using a projection system. At least one component of the radiation system and/or projection system that experiences a thermal load in use is made of a low coefficient of thermal expansion material such that the coefficient of thermal expansion has a zero-crossing temperature between a manufacturing temperature of the component and a mean operating temperature of the component.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
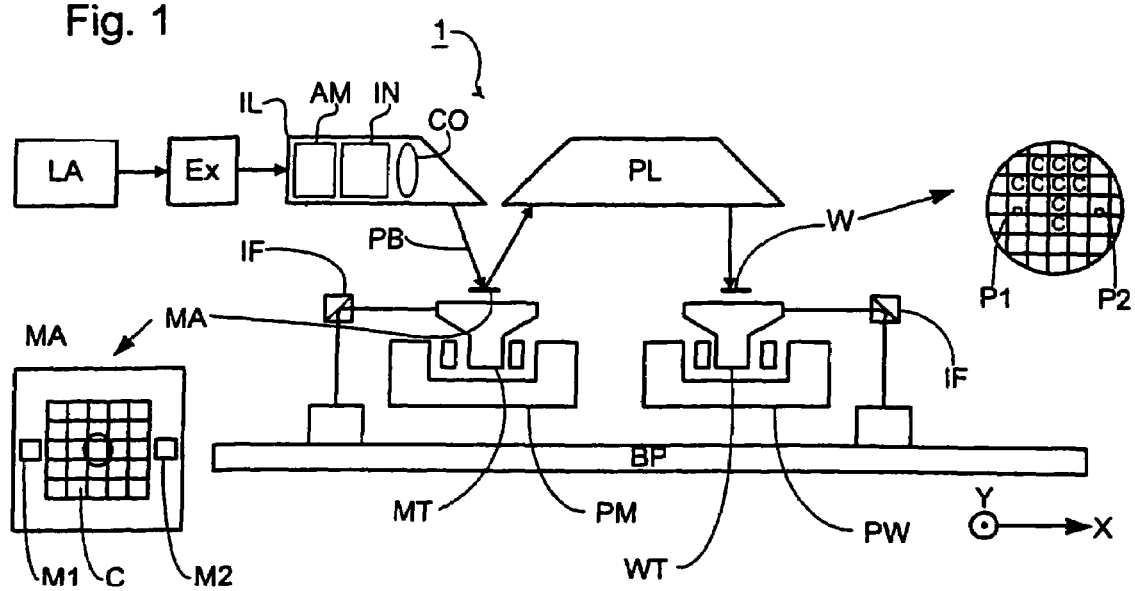
FIG. 1 depicts a lithographic projection apparatus according to an embodiment of the invention.

FIG. 1 schematically depicts a lithographic projection apparatus 1 according to an exemplary embodiment of the invention. The apparatus 1 includes a base plate BP; a radiation system Ex, IL constructed and arranged to supply a beam PB of radiation (e.g. EUV radiation), which in this particular case also comprises a radiation source LA; a first object table (mask table) MT provided with a mask holder that holds a mask MA (e.g. a reticle), and connected to a first positioning device PM that accurately positions the mask with respect to a projection system or lens PL, a second object table (substrate table) WT provided with a substrate holder that holds a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
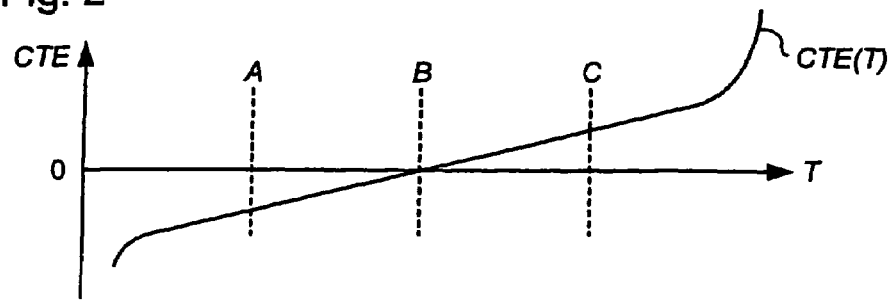
FIG. 2 is a graph illustrating the temperature dependence of the coefficient of thermal expansion (CTE) of a glass (or glass ceramic) used in the present invention.

FIG. 2 illustrates the temperature dependence of the coefficient of thermal expansion of a low-CTE glass ceramic, such as ZERODUR™, or glass, such as ULE™, which may be used to make the substrates of multilayer mirrors in the illumination and projection systems of the lithographic apparatus 1. It can be seen that the curve CTE(T), the coefficient of thermal expansion as a function of temperature T, crosses zero at a temperature B and is substantially linear for a range of temperatures either side of B. According to the invention, the optical element is manufactured at a temperature A and operated at a mean temperature C such that A and C are within the range of temperatures for which CTE(T) is substantially linear and B is between A and C so that:

$$A \leq B \leq C \text{ or } A \geq B \geq C \quad (1)$$

Preferably, the zero-crossing temperature B is midway between the manufacturing temperature A and the mean operating temperature C so that:

$$B = \frac{A+C}{2} \quad (2)$$

In the more general case, where CTE(T) is not linear in the range from A to C, the glass (or glass ceramic), manufacturing temperature and/or mean operating temperature should be selected such that:

$$\int_A^C CTE(T) \, dT = 0 \quad (3)$$

Figure 3:
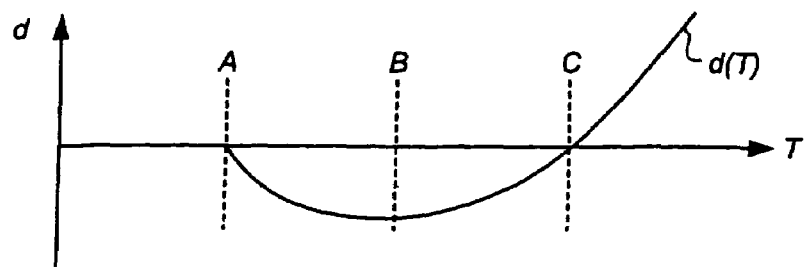
FIG. 3 is a graph illustrating the temperature dependence of the surface deformation of an optical element according to the invention.

If the above criteria are satisfied, the surface deformation of the mirror at the mean operating temperature will be substantially zero. This can be seen from FIG. 3, which illustrates surface deformation d as a function of temperature T. In this example where A is less than C and CTE(T) is negative below B, the initial contraction of the mirror as its temperature rises from A to B is reversed as the temperature continues to rise above B.

As an example, the manufacturing temperature might be 22° C. and the mean operating temperature about 30° C., so that a glass (or glass ceramic) with a CTE zero-crossing of 26° C. would be chosen.

By constructing the component using a material having a coefficient of thermal expansion zero-crossing temperature between the manufacturing and mean operating temperatures of the component, the thermal deformation of the component when operating is minimized or eliminated. Because the coefficient of thermal expansion will, in general, be negative below the zero-crossing temperature and positive above, as the temperature of the component changes from its manufacturing temperature to its operating temperature, the component will deform initially but those deformations will be reversed the other side of the zero-crossing temperature.

The ideal temperature of the zero-crossing will depend on the shape of the coefficient of thermal expansion as a function of temperature in the region of the zero-crossing. If the coefficient of thermal expansion is linearly dependent on temperature in that region, a material should be used which has a coefficient of thermal expansion zero-crossing exactly midway between the manufacturing and mean operating temperatures. In general, the manufacturing, zero-crossing and mean operating temperatures should be such that the integral of the temperature dependent coefficient of thermal expansion between the manufacturing and mean operating temperatures is zero, or as close thereto as possible.

The present invention may be applied to any component in a lithographic apparatus but is particularly advantageous when applied to optical elements in the path of the projection beam, especially mirrors in an EUV lithographic apparatus, especially those of the projection system, where surface deformations have the greatest effect on imaging quality, and those in the beginning of the illumination system, where the projection beam intensity is highest, leading to larger temperature variations. The present invention is also particularly applicable to small mirrors where the thermal load is concentrated, again leading to larger temperature variations. It will be appreciated that for multilayer mirrors, only the substrate, and not the multilayer stack, will be made out of the material.

It should be appreciated that high-precision optical elements such as are used in lithography apparatus are normally ground to their final configuration while being maintained at a very constant temperature. However, in the event that manufacturing processes occur at different temperatures it is the temperature of the final polishing and figure checking process that is relevant as the manufacturing temperature for the purposes of the present invention.

Where the material used is a glass, or a glass ceramic such as ZERODUR™, the coefficient of thermal expansion zero-crossing temperature can be selected as desired by appropriate control of the additives and/or the manufacturing process. If necessary, a batch of glass (or glass ceramic) of the desired coefficient of thermal expansion zero-crossing temperature can be manufactured by trial and error. It will be appreciated that while the mean operating temperature of the apparatus might be determined by other considerations, the manufacturing temperature may be adjusted to enable use of a particular glass (or glass ceramic) having a coefficient of thermal expansion zero-crossing temperature that is fixed or only of limited variability.

It is generally preferably for consistency to make all of the optical elements affecting the projection beam in a lithography apparatus from the same batch of material so that if the operating temperatures of the different optical elements differ, the zero-crossing temperature may only be ideal for one element. In that case, the zero-crossing temperature is preferably chosen to be ideal for the mirror having the highest heat load, generally the first mirror.

While specific embodiments of the invention have been described above, it will be appreciated that the invention may be practiced otherwise than as described. The description is not intended to limit the present invention.

What is claimed is:

1. A method of manufacturing a component that will, in use, experience a thermal load and will be operated at a mean operating temperature, the method comprising:
   selecting a material having a coefficient of thermal expansion having a zero-crossing at a first temperature;
   manufacturing the component using the selected material at a second temperature, wherein the first temperature is between the second temperature and the mean operating temperature, so as to minimize deformation of the component at the mean operating temperature.

2. A method according to claim 1, wherein the first temperature is equal to the average of the second temperature and the mean operating temperature.

3. A method according to claim 1, wherein the integral of the coefficient of thermal expansion of the selected material from the second temperature to the mean operating temperature is substantially zero.

4. A method according to claim 1, wherein the selected material is a material having a low magnitude coefficient of thermal expansion at the mean operating temperature.

5. A method according to claim 1, wherein the selected material is a material having a substantially zero coefficient of thermal expansion at the mean operating temperature.

6. A method according to claim 5, wherein the selected material is a glass or a glass-ceramic comprising additives to provide the coefficient of thermal expansion.

7. A method according to claim 1, wherein the second temperature is adjusted to enable use of a material having a coefficient of thermal expansion zero-crossing temperature that is fixed or of a limited variability.

8. A method according to claim 1, wherein the selected material is a material having a coefficient of thermal expansion having a magnitude of less than or equal to $0 \pm 0.10 \times 10^{-6}$/K (0°-50° C.).

9. A method according to claim 1, wherein the selected material is a material having a substantially linear coefficient of thermal expansion between the second temperature and the mean operating temperature.

10. A method according to claim 1, wherein the second temperature is a temperature of a final polishing and figure-checking step of the component.

11. A component for use in a lithographic apparatus, the apparatus being configured to project a patterned beam of radiation onto a target portion of a substrate, wherein the component is made of a material having a coefficient of thermal expansion having a zero-crossing at a first temperature between a second temperature at which the component is manufactured and a mean operating temperature of the component.

12. A component according to claim 11, wherein the first temperature is equal to the average of the second temperature and the mean operating temperature.

13. A component according to claim 11, wherein the integral of the coefficient of thermal expansion of the material from the second temperature to the mean operating temperature is substantially zero.

14. A component according to claim 11, wherein the material is a material having a low magnitude coefficient of thermal expansion at the mean operating temperature.

15. A component according to claim 11, wherein the material is a material having a substantially zero coefficient of thermal expansion at the mean operating temperature.

16. A component according to claim 11, wherein the component is an optical component in a radiation system, or a projection system, or both the radiation system and the projection system of the lithographic apparatus.

17. A component according to claim 16, wherein the optical component is an optical element in the radiation system and/or the projection system that experiences, in use, a highest thermal load.

18. A component according to claim 16, wherein the optical component is a mirror.

19. A component according to claim 18, wherein the mirror comprises a substrate manufactured from a material having a low coefficient of thermal expansion and a multilayer stack.

20. A component according to claim 18, wherein the mirror comprises a substrate manufactured from a material having a substantially zero coefficient of thermal expansion and a multilayer stack.

21. A component according to claim 11, wherein the material is a glass or a glass-ceramic comprising additives to provide the coefficient of thermal expansion.

22. A component according to claim 11, wherein the material is a material having a coefficient of thermal expansion having a magnitude of less than or equal to $0\pm0.10\times10^{-6}$/K ($0°$-$50°$ C.).

23. A component according to claim 11, wherein the material is a material having a substantially linear coefficient of thermal expansion between the second temperature and the mean operating temperature.

24. A component according to claim 11, wherein the second temperature is a temperature of a final polishing and figure-checking step of the component.

25. A lithographic apparatus, comprising:
a radiation system configured to provide a beam of radiation;
a support configured to support a patterning device, the patterning device configured to pattern the beam according to a desired pattern;
a substrate table configured to hold a substrate;
a projection system configured to project the patterned beam of radiation onto a target portion of the substrate, wherein at least one component in the apparatus that in use experiences a thermal load is made of a low coefficient of thermal expansion material having a coefficient of thermal expansion having a zero-crossing at a temperature substantially midway between a manufacturing temperature and a mean operating temperature of the at least one component.

26. A device manufacturing method, comprising:
providing a beam of radiation using a radiation system;
patterning the beam of radiation with a pattern in its cross-section;
projecting the patterned beam of radiation onto a target portion of a layer of radiation-sensitive material at least partially covering a substrate using a projection system, wherein at least one component in the radiation system, or the projection system, or both the radiation system and the projection system, experiencing a thermal load has a mean operating temperature and is made of a low coefficient of thermal expansion material such that a coefficient of thermal expansion zero-crossing temperature of the material is substantially midway between a manufacturing temperature of the at least one component and the mean operating temperature.

* * * * *